Jan. 5, 1971 KOU-ICHI HAYAMIZU 3,553,599

BIAS CONTROL CIRCUIT FOR SEMICONDUCTOR AMPLIFIER

Filed Feb. 17, 1969

5 Sheets-Sheet 1

United States Patent Office 3,553,599

Patented Jan. 5, 1971

3,553,599

BIAS CONTROL CIRCUIT FOR SEMICONDUCTOR AMPLIFIER

Kou-ichi Hayamizu, Itami, Hyogo Prefecture, Japan, assignor to Mitsubishi Denki Kabushiki Kaisha, Tokyo, Japan

Filed Feb. 17, 1969, Ser. No. 799,671

Claims priority, application Japan, Feb. 20, 1968, 43/10,640, 43/10,641

Int. Cl. H03g *3/50*

U.S. Cl. 330—29 8 Claims

ABSTRACT OF THE DISCLOSURE

An OTL type amplifier of complementary or quasi-complementary transistor structure has connected between a voltage source and an output of one of the output transistor a parallel arrangement of diode and resistor to detect a current flowing through the transistor. The detected current passes through a low-pass filter and after amplification it is applied to a base of a control transistor. A voltage across its emitter and collector controls the amplifier to be put in the class B or AB operation.

BACKGROUND OF THE OPERATION

This invention relates to an electronic circuit for supplying a stable operating current and/or voltage to an active element such as an amplifier put in the class B or imperfect class AB operation.

The OTL (output transformer-less) type of transistorized amplifiers with which the invention is particularly concerned is generally of the complementary transistor structure and comprises a transistorized pre-amplifier stage, a transistorized conversion stage for converting a single ended signal applied thereto to a push-pull signal, and a transistorized power amplifier stage for supplying an amplified current to the associated load with a pair of transistors in the conversion stage biased by a semiconductor diode. In the conventional OTL type amplifiers those conversion transistors have been normally biased insufficiently to eliminate the crossover distortion and particularly when the particular input signal is low in level.

In order to prevent the occurrence of the crossover distortion, it has been previously proposed to employ a plurality of diodes to highly bias the associated conversion transistors or to employ various combinations of diodes and resistors. Such measures each could be adapted only for a particular source voltage, a particular ambient temperature and particular transistors specially designed for that application. A change in ambient temperature, a variation in source voltage and/or the replacement of a circuit element or elements involved has led to a great change in quiescent current flowing through the associated last stage or power amplifier stage. The determination of the quiescent current has previously been one of the most serious problems encountered in designing OTL type amplifiers.

SUMMARY OF THE INVENTION

Accordingly it is an object of the invention to provide a new and improved electronic circuit for controlling a current flowing through an active element for supplying an electrical power to a load, to a predetermined level substantially regardless of the ambient temperature, the associated source voltage and the replacement of a circuit element or elements involved.

It is another object of the invention to provide a new and improved electronic circuit permitting a source voltage to be effectively available for the associated load with a minimum quantity of electric power consumed by a detection circuit for detecting a current flowing through an active element for supplying an electric power to the associated load.

It is still another object of the invention to provide a new and improved electronic circuit including means permitting an electrical charge excessively accumulated on a capacitor forming a part of a low-pass filter to be discharged within a time far shorter than its charging time ensuring that the crossover distortion at higher frequencies is substantially eliminated with no effect upon the system operated with the quiescent and lower frequency signals.

It is an additional object of the invention to provide a new and improved control circuit for controlling a transistorized amplifier to supply an electrical power to the associated load such that with an excessively high input applied to the circuit, a biasing minimum voltage supplied to the transistors of the amplifier by the circuit is maintained at or above a predetermined magnitude enabling the transistors to amplify a signal applied thereto.

It is another object of the invention to provide a new and improved transistorized circuit for controlling a transistorized amplifier to supply an electrical power to the associated load ensuring the proper operation of the amplifier in spite of the secular variation of the circuit while preventing a flow of excessive current through the last stage of the amplifier immediately after the associated source of electrical power has energized the amplifier.

With the above cited objects in view the invention resides in an electronic circuit for controlling an active element connected in series circuit relationship between a source of electrical power and a load to supply an electrical power to the load including operation determining means for determining the active element to be put in the class B or AB operation, characterized by detector means connected between the source and the active element to detect a current flowing through the active element, and low-pass filter means connected to the detector means to remove an alternating current component from the detected output from the low-pass filter means to provide a substantially direct current output, the operation determining means including a three terminal control element having applied thereto the substantially direct current output.

In a preferred embodiment of the invention the detector means may include a semiconductor diode and a resistor connected in parallel to the diode, the low-pass filter means including a resistor-capacitor network, and the control element may include a transistor having a base electrode applied with the output from the low-pass filter means and amplified by a transistor and an emitter and a collector electrode connected to inputs of a transistorized amplifier providing the active element.

BRIEF DESCRIPTION OF THE DRAWINGS

The invention will become more readily apparent from the following detailed description taken in conjunction with the accompanying drawings in which.

DESCRIPTION OF THE PREFERRED EMBODIMENTS

While the invention has a wide variety of the applications it is particularly suitable for use with OTL type amplifiers and will now be described in terms of the OTL type amplifiers.

Figure 1:
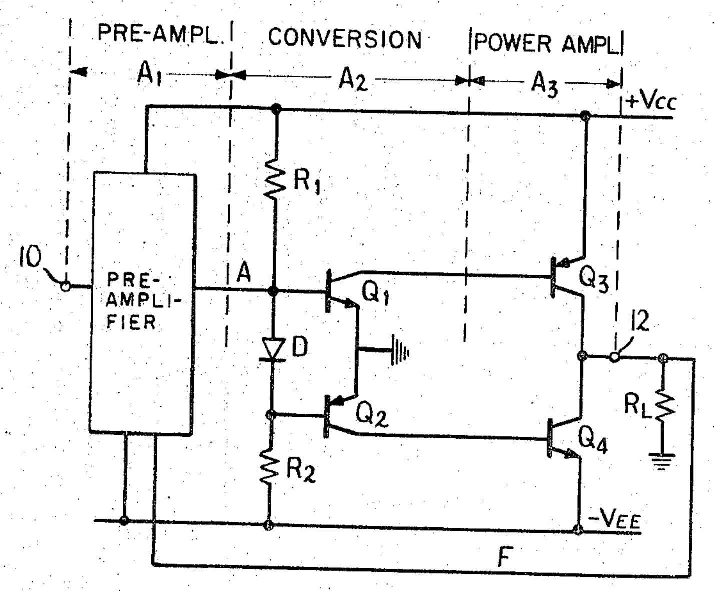
FIG. 1 PRIOR ART
FIG. 1 is a schematic diagram of a circuit put in the class B or imperfect class AB operation in accordance with the teachings of the prior art.

Referring now to the drawings and in particular to FIG. 1, there is illustrated an OTL type amplifier constructed in accordance with the teachings of the prior art. The arrangement illustrated is of the complementary transistor structure including PNP type and NPN type transistors incorporated in pairs and comprises a pre-amplifier stage $A_1$ designated at single block, a conversion stage $A_2$ for converting a single ended signal applied thereto a push-null signal, and a last or power amplifier stage $A_3$ for supplying an amplifier current to a load.

The pre-amplifier stage A is connected across a pair of positive and negative buses $+V_{CC}$ and $-V_{EE}$ respectively with its input connected to an input terminal 10. The pre-amplifier stage $A_1$ has its output connected to an input point A to the conversion stage $A_2$ comprising an NPN type transistor $Q_1$ including a base electrode connected to the input point A, an emitter electrode, and a collector electrode, and a PNP type transistor $Q_2$ including a base electrode connected to the input point A through a semiconductor diode D and an emitter electrode connected to the emitter electrode of the transistor $Q_1$ and also to the ground. The diode D serves to cause the operation of the transistors $Q_1$ and $Q_2$ to approach the class AB operation in the well-known manner. As shown in FIG. 1, the diode D is suitably biased by the buses $+V_{CC}$ and $-V_{EE}$ through resistors $R_1$ and $R_2$ respectively.

The NPN and PNP transistors $Q_1$ and $Q_2$ include the respective collector electrodes connected to base electrodes of PNP and NPN transistors $Q_3$ and $Q_4$ forming the last amplifier stage $A_3$. The transistors $Q_3$ and $Q_4$ include collector electrodes connected together and also to an output terminal 12 and emitter electrodes connected to the positive and negative buses $+V_{CC}$ and $-V_{EE}$ respectively. The output terminal 12 is connected to a grounded load $R_L$ and also to the pre-amplifier stage $A_1$ through an electric load F forming a feedback path for direct and alternating currents. The feedback path F serves to negatively feed a potential at the terminal 12 back to the pre-amplifier stage $A_1$ to change a potential at the point A so that the potential at the terminal 12 is maintained zero for the quiescent current.

With the arrangement illustrated the diode D functions to bias the emitter junctions of the transistors $Q_1$ and $Q_2$ and therefore these transistors for the purpose of eliminating the crossover distortion. This measure, however, has provided the bias voltage insufficient to eliminate the crossover distortion. To compensate for this insufficience of the bias voltage, it has been normally practiced to effect the negative feedback of alternating current through the feedback path F with the result that the output signal has tended not to be identical in waveform to the corresponding input signal. This tendency has been particularly enhanced at low signal levels. Thus there have been proposed various attempts to more deeply bias the transistors $Q_1$ and $Q_2$ through the use of resistors connected respectively to the emitter electrodes thereof and of a plurality of diodes in place of the single diode D, and to use various combinations of diodes and resistors. Such measures each were adaptable only for a particular source voltage, a particular ambient temperature and transistors specially specified. A change in ambient temperature, a variation in source voltage and/or the replacement of a circuit element or elements causes a greater change in quiescent currents flowing through the transistors $Q_3$ and $Q_4$. Therefore the determination of those quiescent currents has been one of the most serious problems encountered in designing OTL type amplifiers.

The invention has solved that problem at a stroke by the provision of epochal means for directly detecting a magnitude of current required to be controlled and stabilizing the detected current through a negative feedback loop without a tedious means for indirectly driving and controlling the current required to be controlled. In other words, the invention provides a direct control as compared with the so-called indirect control means according to the teachings of the prior art.

Figure 2:
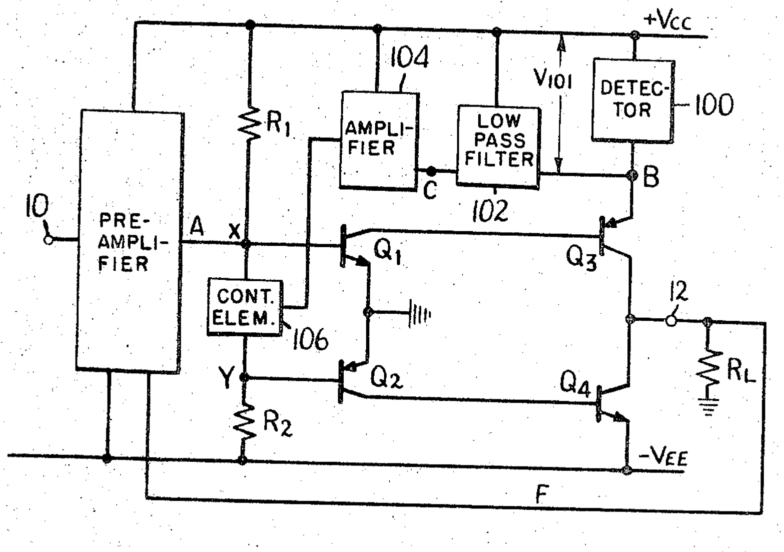
FIG. 2 is a schematic diagram, partly in block form of one embodiment of the invention applied to the circuit shown in FIG. 1.

Referring now to FIG. 2, there is illustrated a generic form of the invention applied to the amplifier as shown in FIG. 1. A detector generally designated by the reference numeral 100 is connected to the positive bus $+V_{CC}$ and the emitter electrode of the PNP type transistor $Q_3$ to detect a magnitude of current required to be controlled or flowing through the transistor $Q_3$. The detected current is then applied through a low-pass filter generally designated by the reference numeral 102 to an amplifier generally designated by the reference numeral 104 where it is suitably amplified. The amplified current is applied to an input to a three terminal control element generally designated by the reference numeral 106 substiuting the diode D as shown in FIG. 1. The control element 106 has further a pair of terminals X and Y connected to the junctions of the respective resistors $R_1$ and $R_2$ and the base electrodes of the conversion transistors $Q_1$ and $Q_2$ respectively. A voltage across the terminals X and Y is controlled in the manner as will be described hereinafter so that currents flowing through the amplifying transistors $Q_3$ and $Q_4$ are maintained at predetermined levels independent of the ambient temperature, the source voltage, the replacement of a circuit element or elements involved, etc.

It has been found that the invention is effective in the case active or passive elements involved are much dispersed in characteristics from one another, the capabilities of circuit elements actually available are so much changed from the desired design values that the prior art measures are not quite utilized as in integrated circuits, the dependence of the capabilities upon the source voltage, the ambient temperature etc. of the circuit elements greatly affects the operation of the system and so on.

Figure 3:
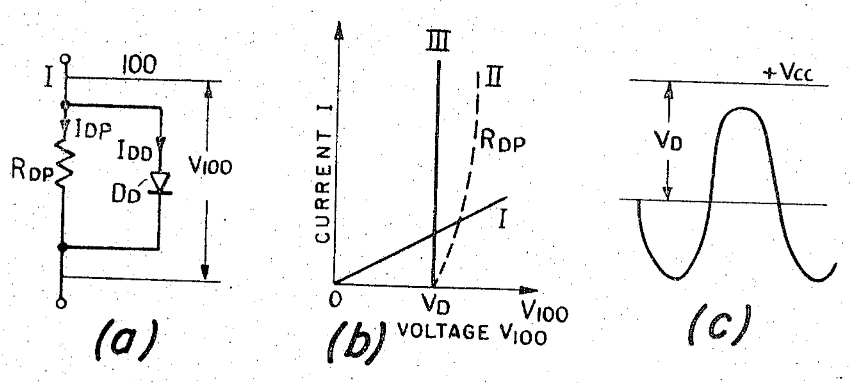
FIGS. 3*a*, *b* and *c* are views useful in explaining the operation of the circuit illustrated in FIG. 2.

Referring now to FIG. 3*a*, it is seen that the detector 100 includes a nonlinear element such as a semiconductor diode $D_D$ connected in parallel circuit relationship with a resistor $R_{DP}$ which is the ideal form of the detector. In order to effectively utilize the associated source voltage, it is desirable to decrease a minimum or threshold voltage detectable by the detector 100, as low as possible. Thus it is convenient and most general to use, as the nonlinear element, a semiconductor diode having a current-to-voltage characteristic such as shown at dotted line in FIG. 3*b*.

With the detector 100 composed of such as diode connected in shunt to the resistor, a current I flowing through the detector 100 is expressed by $$\frac{V_{100T}}{R_{DP}}+I_{DD}$$

where $R_{DP}$ also represents the magnitude of resistance of the resistor $R_{DP}$, and $I_{DD}$ represents a current flowing through the diode $D_D$ having a voltage thereacross equal to $V_{100T}$. In FIG. 3*b* $V_{100T}/R_{DP}$ is expressed by at a filled solid line I, $I_{DD}$ is expressed at dotted line II, and solid line III is the ideal current-to-voltage characteristic of a nonlinear element substituting the diode $D_D$. Under these circumstances, the current I can vary by changing the resistance $R_{DP}$ and the voltage $V_{100T}$ should be a voltage with which the amplifier 104 is operated. Thus it will be appreciated that the voltage $V_{100T}$ depends upon the circuit configuration of the amplifier 104.

It is assumed that for the quiescent current, a voltage $V_B$ at the junction of the detector 100 and the emitter of the transistor $Q_3$ (see FIG. 2) has preselected to have a magnitude represented at a point $V_D$ shown in FIG. 3*b*. Under the assumed condition, when the transistor $Q_3$ has responded to that portion of an input signal in one half cycle of alternating current to be conducting to have a high emitter current therethrough the voltage $V_B$ decreases in magnitude. In the next half cycle, the transistor $Q_3$ becomes nonconducting while the transistor $Q_4$ is conducting with the result that no current flows through the detector 100. Then due to the negative feedback through the loop 100 through 106, the voltage $V_B$ at the point B will much change as shown in FIG. 3*c*.

If such a voltage signal $V_B$ as developed is amplified by the amplifier 104 and applied to the control element 106 then a voltage across the terminals X and Y of the control element 106 changes as the signal $V_B$ varies. This change in voltage also serves to continuously maintain the potential at the point B or the current flowing through the detector 100, substantially constant resulting in no supply of an electrical power corresponding to the input signals to the load $R_L$.

In order to avoid this objection, the low-pass filter 102 is connected to the detector 100 to provide a smoothed direct current signal to the amplifier 104. The filter may be preferably formed of a resistor and capacitor network. If the amplifier 102 has a sufficiently high gain a difference between voltages $V_B$ and $V_C$ at the input and output of the low-pass filter 102 or at the points B and C (see FIG. 2) can be sufficiently small. In other words, the voltage $V_C$ can be regarded to be nearly equal in magnitude to the voltage $V_B$.

It will be readily apparent that the low-pass filter 102 has preferably a cutoff frequency as low as possible although the cutoff frequency has the intimate relationship with a desired minimum frequency at and above which the associated OTL type amplifier performs the amplifying operation. If the cutoff frequency of the low-pass filter can not be selected to be so low for any reason and the output from the amplifier 104 changes in accordance with the input signal then it is necessary to connect a suitable capacitor (not shown in FIG. 2) across the terminals X and Y of the control element 106 to absorb that change in output from the amplifier. In other words, the connection of the capacitor across the terminals X and Y is possible to increase the cutoff frequency of the low-pass filter.

The amplifier 104 is required to have a gain as high as possible for the reasons that the amplifier 103 having applied thereto the voltage $V_B$ should provide a sufficiently high input voltage for the control element 106 and that the voltage $V_B$ nearly equals the voltage $V_C$.

While an active element or elements used in the amplifier 104 is or are preferably formed of a transistor or transistors, it has been found that any other type of transistors such as field effect transistors may be equally used provided that it has the input and output characteristics substantially corresponding to the output and input characteristics respectively of the low-pass filter and control elements 102 and 106 respectively.

Finally the control element 106 is required to perform the function of suitably biasing the associated transistors $Q_1$ and $Q_2$ while permitting the required current to flow thereinto and therefrom through the resistor $R_2$ or its equivalent circuit. The control element 106 thus is typically formed of a suitable transistor having a base electrode providing an input terminal and an emitter and a collector electrode providing the terminals X and Y respectively. Alternatively the element may be formed of a double base diode having its two bases providing the terminals X and Y and an emitter electrode providing an input terminal. Further a field effect transistor may be utilized with its source and drain electrodes providing the terminals X and Y respectively and with its gate electrode providing an input terminal. If deisred, any of composite arrangements of the above-mentioned transistors may be used with or without any suitable passive element or elements.

However, since transistors are most conveniently used to incorporate the invention into integrated circuits, the invention will be subsequently described in terms of the control element being formed of a transistor or transistors.

Figure 4:
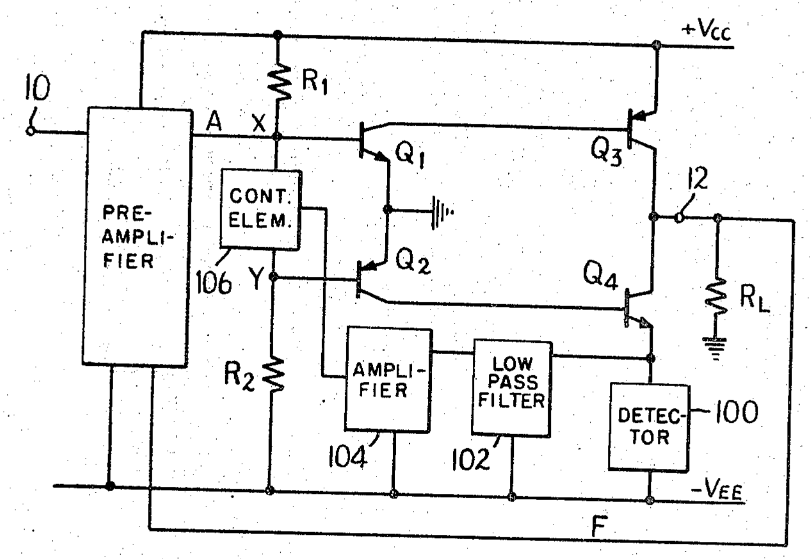
FIG. 4 is a view similar to FIG. 2 but illustrating a modification of the invention.

While the invention has been illustrated in conjunction with the positive bus $+V_{CC}$ put at the reference voltage level, it may be applied to the case the negative bus $-V_{EE}$ is put at the reference voltage. Such a case is illustrated in FIG. 4 wherein the same reference characters designate the components identical to those shown in FIG. 2. That is, the detector 100, low-pass filter and amplifier 102 and 104 respectively are connected to the negative bus $-V_{EE}$. In other respects the arrangement is identical to that shown in FIG. 2.

Figure 5:
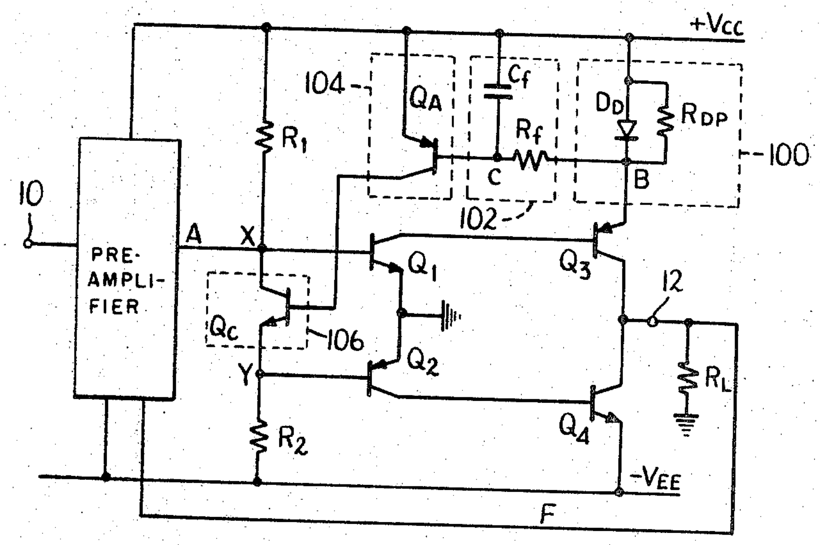
FIGS. 5 and 6 are views illustrating the details of some of the blocks shown in FIGS. 2 and 4 respectively.

Referring now to FIG. 5 wherein like reference characters designate the components identical to those shown in FIG. 2, there is illustrated the details of a fully transistorized circuit constructed on the basis of the arrangement as shown in FIG. 2. A detector 100 includes a semiconductor diode $D_D$ shunted by a resistor $R_{DP}$ such as shown in FIG. 3*a* and a low-pass filter 102 is composed of a series resistor $R_f$ and a parallel capacitor $C_f$. An amplifier 104 includes a transistor $Q_A$ shown as being of the PNP type and a control element 106 includes a transistor $Q_B$ shown as being of the NPN type and having a base electrode providing an input terminal and a collector and an emitter electrode providing the terminals X and Y respectively. In other respects the arrangement is the same as that illustrated in FIG. 2.

In OTL type amplifiers, it is commonly practiced to serve a biasing resistor for a conversion transistor also as a biasing resistor for the associated pre-amplifier $A_1$. Therefore it is assumed that the resistor $R_1$ as shown in FIG. 5 serves as a biasing resistor for both the pre-amplifier $A_1$ and the conversion transistor $Q_1$. Also assuming that the other conversion transistor $Q_2$ has a base current of $I_{B2}$, and a voltage of $V_{EB2}$ across the emitter and base thereof, an emitter current $I_{EC}$ flowing through the transistor $Q_2$ is expressed by the following equation.

$$I_{EC}=\frac{V_{EE}-V_{EB2}}{R_2}-I_{B2}$$

Figure 7:
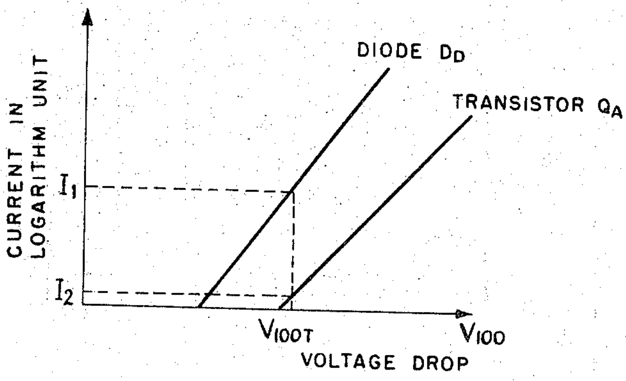
FIG. 7 is a graph useful in explaining the operation of the invention.

A base current $I_{BA}$ for the amplifying transistor $Q_A$ required to cause this emitter current $I_{EC}$ to flow through the transistor $Q_2$ is given by the equation $$I_{BA}=\frac{I_{EC}}{(H_{FEC}+1)H_{FEA}}$$

wherein $H_{FEC}$ and $H_{FEA}$ are the current-amplification factors of the emitter common transistors $Q_C$ and $Q_A$. On the other hand, the diode $D_D$ in the detector 100 is required to provide a high current at its output and therefore it has necessarily an area of junction greater than an area of emitter junction of the transistor $Q_A$. Accordingly the diode $D_D$ is normally selected to have a flow of forward current therethrough higher than a flow of current through the emitter junction of the transistor $Q_A$ as shown in FIG. 7 wherein the axis of ordinates represents current I in logarithmic unit and the axis of abscissas represents voltage drop $V_{100}$ across the detector 100. In FIG. 7, $I_1$ is a current flowing through the diode $D_D$ and $I_2$ is a current flowing through the emitter junction of the transistor $Q_A$ for a voltage drop of $V_{100T}$ across the diode $D_D$.

In order to determine the current flowing through the detector 100 for the quiescent current by the circuit constants involved and also to permit that current to much change whenever it is required to do so, it is desirable to determine that current by a current flowing through the resistor $R_{DP}$ rather than through the diode $D_D$. This means that the voltage drop $V_{100}$ across the detector is necessarily low thereby to preset the current flowing through the diode $D_D$ to a low magnitude and further suggest a low current flowing through the amplifying transistor $Q_A$. With the particular voltage drop of $V_{100T}$ across the detector 100 as shown in FIG. 7, the current flowing through the resistor $R_{DP}$ is far greater than the current $I_1$ flowing through the diode $D_D$. If it is desired to operate the feedback loop 100–102–104–106 according to the invention with this voltage drop corresponding to the current levels just described then it should be apparent that the following relationship must be held:

$$I_2 > I_{BA} = \frac{|V_{100T} - V_{FBA}|}{R_f} = \frac{I_{EC}}{(H_{FEC}+1)H_{FEA}}$$

where $R_f$ is the series resistance of the low-pass filter and $V_{FBA}$ is a voltage across the emitter and base of the transistor $Q_A$ required to cause the base current of $I_{BA}$ to flow through the transistor. In other words, even if the voltage drop across the diode $D_D$ is within the region of small currents flowing through that diode, the transistor $Q_A$ must have flowing thereinto a current sufficient to operate the present feedback loop. This can readily be accomplished by increasing the current-amplification factors of the transistors $Q_A$ and $Q_C$ with the voltage drop across the series resistance $R_f$ of the low-pass filter 102 negligible. For example, assuming that for $I_{EC}=1$ ma. the the transistors $Q_A$ and $Q_C$ have the respective current-amplification factors $H_{FEA}$ and $H_{FEC}$ equal to 20 and 50 respectively, the voltage drop across the resistance $R_f$ amounts only at 10 mv. even though the resistance is as high as 10 KΩ. That is, a voltage at point C or at the output of the filter can be regarded to be substantially equal to a voltage at point B or at the input thereto.

Figure 6:
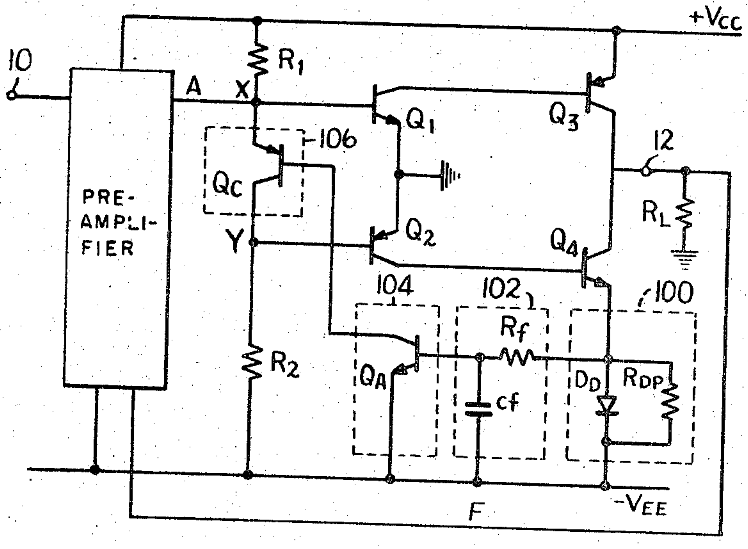

FIG. 6 illustrates the details of the invention applied to the arrangement as shown in FIG. 4. The arrangement is different from that shown in FIG. 5 only in that in the former arrangement a diode $D_D$ is connected between the emitter electrode of the transistor $Q_4$ and the negative bus $-V_{EE}$ with its polarity reversed from that shown in FIG. 5 and that the transistors $Q_A$ and $Q_C$ are of the NPN type and PNP type respectively. In other respects both the arrangement are identical to each other and like reference characters designate the components identical to those shown in FIG. 5.

While FIGS. 2, 4, 5 and 6 illustrate the arrangements using a pair of voltage sources such as the positive and negative buses $+V_{CC}$ and $-V_{EE}$ it is to be understood that the invention is equally applicable to arrangements using a single source of voltage. To this end, the load $R_L$ may be serially connected to one end of a high capacitance capacitor connected at the other end to the ground and a resistance voltage divider network is suitably connected to the series combination of the load and capacitor so as to apply to their junction a potential determined by a ratio of the voltage $V_{CC}$ to the voltage $V_{EE}$ although such an arrangement is not illustrated.

Figure 8:
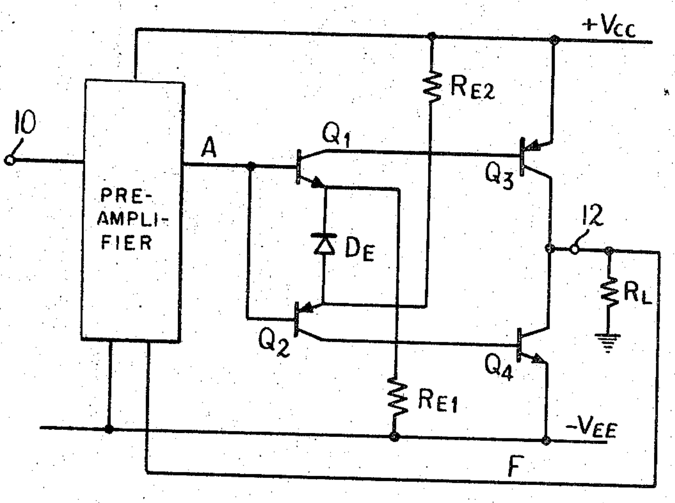
FIG. 8 PRIOR ART
FIG. 8 is a schematic diagram of another circuit put in the class B or imperfect class AB operation in accordance with the teachings of the prior art.

FIG. 8 wherein like reference characters designate the components corresponding to those shown in FIG. 1 illustrates another form of the conventional OTL type amplifiers to which the invention is equally applicable. In FIG. 8, a pair of conversion transistors $Q_1$ and $Q_2$ include base electrodes connected together and emitter electrodes connected to each other through a semiconductor diode $D_E$ and also connected to a pair of buses $-V_{EE}$ and $+V_{CC}$ through biasing resistors $R_{E1}$ and $R_{E2}$ respectively for the purpose of putting the transistors in the class AB operation. In other respects the arrangement is identical to that shown in FIG. 1.

Figure 9:
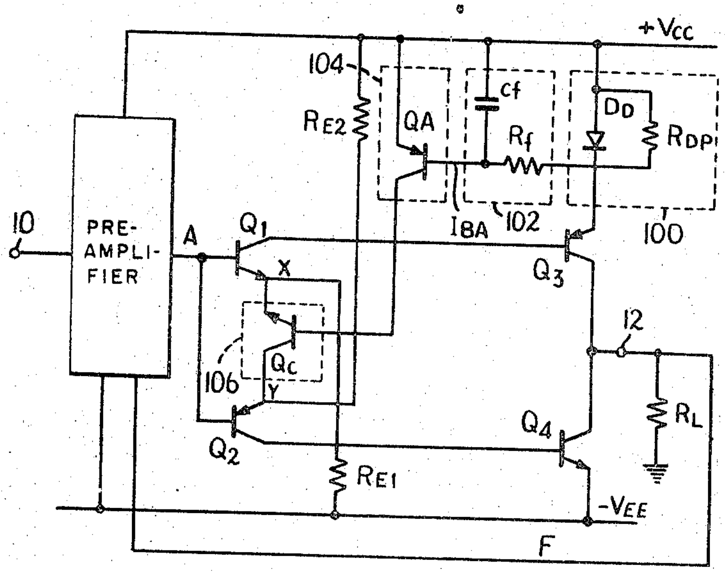
FIG. 9 is a schematic diagram of another modification of the invention applied to the circuit illustrated in FIG. 8.

FIG. 9 wherein like reference characters designate the components corresponding to those shown in FIG. 5 illustrates a modification of the invention applied to the arrangement as shown in FIG. 8 with the positive bus $+V_{CC}$ put at the reference potential. By comparing FIG. 9 with FIG. 5 it will readily be understood that the arrangement of FIG. 9 is operated in the same manner as that shown in FIG. 5.

Further it is to be understood that the invention is equally applicable to the arrangement of FIG. 8 having the negative bus $-V_{EE}$ put at the reference potential to provide an electronic circuit similar to that shown in FIG. 6.

Figure 10:
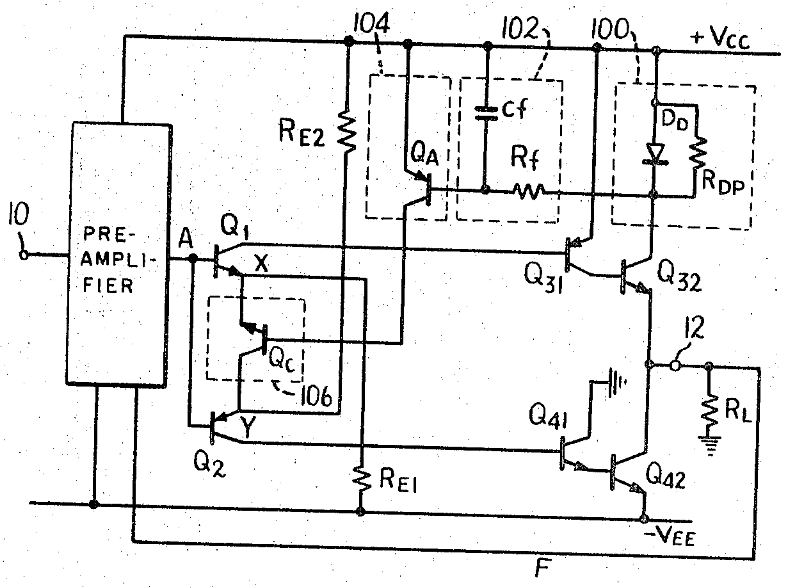
FIG. 10 is a view similar to FIG. 9 but illustrating the invention applied to an amplfier of the quasi-complementary structure.

If desired, each of the transistors $Q_3$ and $Q_4$ may be replaced by a plurality of interconnected transistors. For example, FIG. 10 shows another modification of the invention wherein instead of the PNP type transistor $Q_3$ as previously described a PNP type transistor $Q_{31}$ including an emitter electrode directly connected to the positive bus $+V_{CC}$ and a collector electrode connected to a base electrode of an NPN type transistor $Q_{32}$. At the same time, instead of the NPN type transistor $Q_4$ as previously described, an NPN type transistor $Q_{41}$ including a collector electrode connected to the ground and an emitter electrode connected to a base electrode of an NPN type transistor $Q_{42}$. In other respects the arrangement is identical to that shown in FIG. 9 and therefore like reference characters designate the components identical to those shown in FIG. 9. In other words, the last or amplifying state is of the so-called quasi-complementary transistor structure suitable for use in the case that stage is demanded to have a high current amplification factor or a high current PNP type transistor is not available. If desired, the conversion transistors $Q_1$ and $Q_2$ may be of the quasi-complementary transistor structure.

With the quasi-complementary transistor structure used, the arrangement having the positive bus $+V_{CC}$ put at the reference potential as shown in FIG. 10 is preferable as compared with an arrangement having the negative bus $-V_{EE}$ put at the reference potential for the following reasons: To control each negative half cycle of alternating current, the transistors $Q_{41}$ and $Q_{42}$ are arranged to be driven to the saturation voltage of the transistor $Q_{42}$. That is, the transistor $Q_{41}$ has its collector potential always maintained equal to or higher than that of the transistor $Q_{42}$. On the other hand, the transistors $Q_{31}$ and $Q_{32}$ for controlling each positive half cycle of alternating current are arranged such that the transistor $Q_{31}$ is first saturated as the output increase in amplitude. Thus in the absence of the detector 100, the collector junction of the transistor $Q_{32}$ is always put in its reversely biased state in which the transistor $Q_{42}$ bears a larger portion of an ineffective voltage not contributing to the amplitude of output than the transistor $Q_{41}$ with the result that both transistors are different from each other in consumption of power and therefore operating temperature.

According to the invention, the detector 100 is connected from the collector electrode of the transistor $Q_{32}$ to the positive bus $+V_{CC}$ serving to detect that ineffective voltage while at the same time permitting both the transistors $Q_{32}$ and $Q_{42}$ to be saturated to a similar extent resulting in the elimination of the problem of different increases in temperature therebetween.

Also, if desired, either or both of the transistors $Q_A$ and $Q_C$ may be similarly replaced by a plurality of interconnected transistors.

Upon forming any of the arrangements as previously described into an integrated circuitry, it is desirable to utilize what is called the lateral PNP type in order to most economically produce PNP transistors. The resulting PNP type transistor has normally a current-amplification factor approximating unity. Thus it has been commonly practiced to effect composite connection of an NPN type transistor to the particular PNP type thus produced to provide a PNP type transistor equivalent having a current-amplification factor equal to the desired magnitude.

Figure 11:
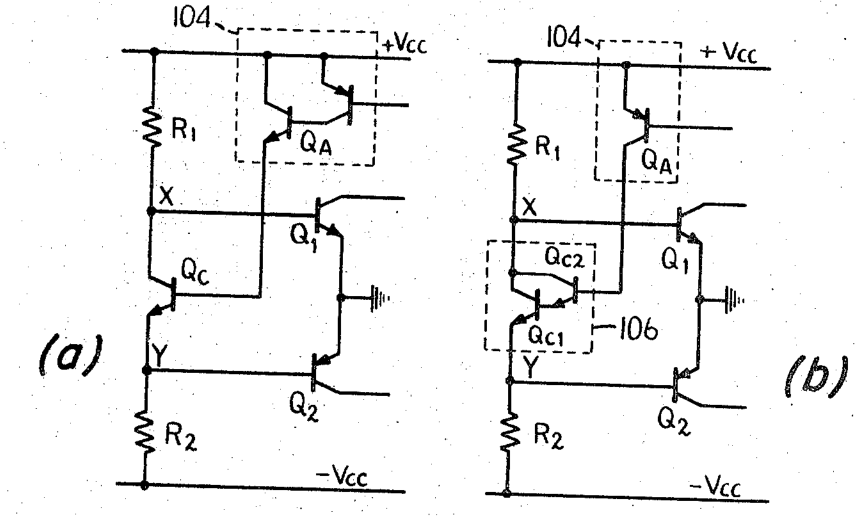
FIGS. 11*a* and *b* are fragmental circuit diagrams illustrating the essential part of different modifications of the invention.
Figure 12:
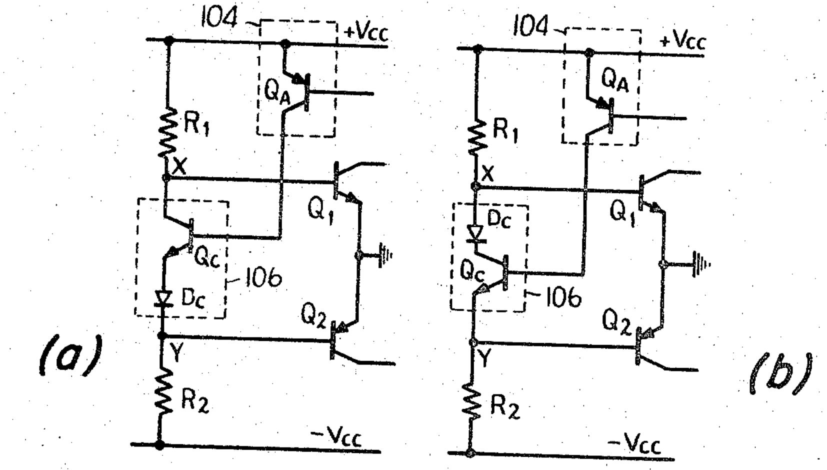
FIGS. 12*a* and *b* are views similar to FIGS. 11*a* and *b* but illustrating a further modification of the invention.

Upon applying this measure to the invention, it is desirable to provide an arrangement as shown in FIG. 12*b* rather than to provide an arrangement as shown in FIG. 12*a*. In FIG. 12*a* the amplifier 104 comprises a PNP type transistor including a base electrode providing an input, emitter electrode connected to a positive bus $+V_{CC}$, and an NPN type transistor including a base electrode connected to the collector electrode of the PNP type transistor, a collector electrode connected to the bus and an emitter electrode providing an output while the control element 106 includes a single NPN type transistor $Q_C$. In FIG. 11*b* the control element 106 includes a pair of NPN type transistors $Q_{C1}$ and $Q_{C2}$ in the Darlington connection while the amplifier 104 includes a single NPN type transistor $Q_A$ having a current-amplification factor $H_{FEA}$ of unity. As well known, the Darlington connection serves to improve the yield with which integrated circuitries can be manufactured. Also it prevents a minimum voltage across the terminals X and Y or the collector and emitter electrodes of the transistor $Q_{C1}$ from falling below a predetermined level. More specifically, assuming that in FIG. 11*a* wherein the control element 106 includes the single transistor $Q_C$, its base region is excessively driven due to a failure of any of the components 100, 102 and 104, the voltage across the terminals X and Y will decrease down to a low saturation voltage across the emitter and collector regions thereof. On the other hand, with the pair of transistors connected in the manner as shown in FIG. 11*b*, the said voltage is absolutely prevented from falling below a voltage across the emitter and base regions of the transistor $Q_{C1}$. This means that the voltage across the terminals X and Y does not fall below a voltage across a single diode connected therebetween in place of the transistors. In other words, the arrangement as shown in FIG. 11*b* can be handled as a unit similar in performance to the conventional one using a single control diode such as shown in FIG. 1 or 8.

In order to provide an arrangement having the performance just described, a semiconductor diode $D_C$ may be connected to an emitter or a collector electrode of a single control transistor $Q_C$ as shown in FIG. 12*a* or *b* and forwardly biased.

The measures as above described in conjunction with FIGS. 11*b*, 12*a* and 12*b* are possible to compensate for such an error in manufacturing and assembling of integrated circuit structures that a very high base current may flow through a transistor connected across the terminals X and Y, or to remedy rejectable products resulting from any deterioration of a circuit component or components involved.

Figure 13:
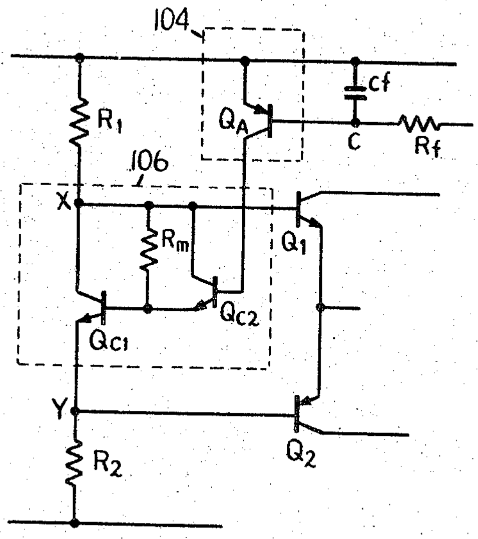
FIG. 13 is a schematic circuit diagram illustrating the essential part of a still further modification of the invention.

FIG. 13 wherein like reference characters designate the components identical to those shown in FIG. 11*b* illustrates a means for extending a range within which the rejectable products such as above described can be remedied. That is, a resistor $R_m$ is connected from the junction of the base and emitter electrodes respectively of the transistors $Q_{C1}$ and $Q_{C2}$ to the terminal X. More specifically, the transistor $Q_{C1}$ has flowing therethrough a base current formed of a current flowing through the resistor $R_m$ and an emitter current flowing through the transistor $Q_{C2}$. In the absence of the resistor $R_m$, the said current includes only a collector current flowing through the associated amplifying transistor $Q_A$. The presence of the resistor $R_m$ permits base current $I_{BA}$ flowing through the transistor $Q_A$ to decrease as compared with the absence of the resistor with the result that a voltage drop across the associated filtering resistor $R_f$ is sufficient to be less than a required input voltage to the transistor $Q_A$ and that even if the current-amplification factors $H_{FEA}$ and $H_{FEC}$ of the transistors $Q_A$ and $Q_C$ is smaller than in the absence of the resistor $R_m$ the proper operation of the system is ensured.

Therefore it will be appreciated that the resistor $R_m$ can effectively remedy such integrated circuit structures including the transistors $Q_A$, $Q_{C1}$ and/or $Q_{C2}$ having the actual amplification factors or factor less than the designed magnitudes or magnitude thereof, requiring a higher input voltage due to the secular variation after having being manufactured or to the deterioration of the input characteristics of the transistor $Q_A$ or having flowing therethrough a high quiescent current due to the filtering resistor $R_f$ having been initially made into or changed to a higher magnitude of resistance.

In addition to remedying the products exhibiting a very high driving current, the use of the second control transistor $Q_{C2}$ or diode $D_C$ permits the tolerance of and a change in the gain of the feedback loop 100–102–104–106 to be much widened leading to a great increase in yield of the resulting integrated circuit structures.

Another purpose of the resistor $R_m$ is to suppress an excessively high current flowing through the transistors $Q_3$ and $Q_4$ immediately after the system has been energized by the associated source of electric power. Such a flow of excessively high current resluts from a time delay with which a potential at the point C or at the output of the low-pass filter and therefore a voltage across the terminals X and Y is built up. Since a current can flow through the resistor $R_m$ immediately after the base electrode of the control transistor $Q_{C1}$ has been energized by the associated source, a voltage across the terminals X and Y is instantaneously built up sufficient to prevent the transistors $Q_3$ and $Q_4$ to be excessively driven.

In FIGS. 11*b*, 12*a*, 12*b* and 13, the control element 106 includes two active elements such as the transistors $Q_{C1}$ and $Q_{C2}$ or the transistor $Q_C$ and the diode $D_C$. If desired the number of the active element may be increased. For example, if each of the transistors $Q_1$ and $Q_2$ is formed of a plurality of transistors the control element 106 may be in the Darlington configuration including transistors whose number is at least equal to the total number of the transistors $Q_1$ and $Q_2$. Thus it will be appreciated that the control element includes the active element at least equal in number to the input conversion transistors of the amplifier.

Referring back to FIG. 5, the frequency response characteristics of the arrangement will be considered for the class AB operation. It is first required to render the magnitude of voltage $V_{XY}$ across the terminals X and Y of the control element 106 independent of the frequency of the input signal to the conversion stage. Alternatively, in order to increase the cutoff frequency of the control transistor, it may be required to render the said voltage higher as the input signal increases in frequency. Otherwise the crossover distortion could occur at high frequencies. This causes a decrease in variety of the applications of the present amplifiers. That is, the environment conditions for the invention will be subject to various limitations.

Then the conversion transistors $Q_1$ and $Q_2$ are not so high in cutoff frequency because of their low current levels. In addition, the amplifying transistors $Q_3$ and $Q_4$ having flowing therethrough high currents includes their base and collector regions where the minority carriers are excessively accumulated. As a result, a problem is brought about in an interval of time for switching the associated signal from the positive to negative waveform thereof and vice versa. These phenomena, the frequency response characteristics of active and passive elements involved, the parasitic circuit elements etc. affect a potential at the point B as shown in FIG. 5 in response to the presence and frequency of the input signal which will be subsequently described in conjunction with FIG. 14.

Figure 14:
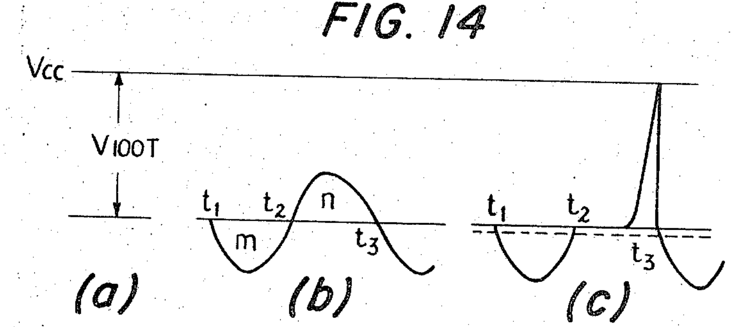
FIG. 14 is a graph useful in explaining the operation of the circuit illustrated in FIG. 5.

In FIG. 14 wherein the axis of abscissas represents time and the axis of ordinates represents a voltage drop across the detector 100, a voltage $V_{100T}$ across the detector 100 as shown at *a* serves to cause a flow of desired quiescent current. If a low frequency power is being supplied to the load $R_L$ then a current flows through the detector diode $D_D$ in one half cycle of alternating current signal beginning at a time point $t_1$ and terminating at a time point $t_2$ as shown in FIG. 14*b*. The resulting forward voltage drop across the diode $D_D$ increases in amplitude. In the other half cycle of the signal between time points $t_2$ and $t_3$ the input signal reverses the conductive state of the transistors $Q_1$ and $Q_2$ from that in the one half cycle. Therefore it is apparent that no current flows through the diode $D_D$.

As shown in FIG. 14*b*, the voltage drop across the diode $D_D$ has one portion *m* rapidly increased in amplitude during its conduction. This portion *m* of the voltage drop will contribute to an excessive charge on the filtering capacitor $C_f$. That is the capacitor $C_f$ will have accumulated thereon a charge in excess of its charge required to stably operate the control loop 100–102–104–106. Due to the feedback action of the control loop, the excessive charge on the capacitor $C_f$ is discharged through the resistor $R_{DP}$ in parallel to the capacitor $C_f$ in the next half cycle of the signal in which the diode $D_D$ is put in its non-conducting state whereby a waveform as shown *n* is formed as shown in FIG. 14*b*. Thus it will be appreciated that, with the just described junction fully performed, an integral of the voltage drop across the diode $D_D$ between the time points $t_1$ and $t_3$, that is to say, the voltage drop as having passed through the low-pass filter having a large time constant is constant regardless of whether or not the input signal is present.

On the other hand, for higher frequencies of the input signal, the diode $D_D$ is impossible to be brought into its non-conducting state immediately after its conduction has terminated due to the high frequency response characteristics of the conversion transistors $Q_1$ and $Q_2$ and other as previously described. As a result, a charge excessively accumulated on the capacitor $C_f$ will have still a higher magnitude even in the case a maximum voltage on the bus $+V_{CC}$ is used to discharge the capacitor as shown in FIG. 14*c*. Therefore an integral of the voltage drop across the diode $D_D$ and therefore a potential at point C decreases at higher frequencies as shown at dotted line in FIG. 14*c*. This results in a decrease in voltage across the control terminals X and Y as compared with the lower frequencies. That is, the crossover distortion occurs at higher frequencies.

The invention also contemplates to eliminate this disadvantage. To this end, the filtering resistor $R_f$ can have connected in parallel thereto a suitable semiconductor diode having a forward voltage-to-current characteristic equal to or better than the input characteristics of the base-to-emitter circuit of the transistor $Q_A$ and so poled as to permit a current to flow from the diode $D_D$ to the transistor $Q_A$. That diode is designated by the reference characters $D_f$ in FIG. 15*a* and should have such a characteristic that the built-up voltage is low with a steep slope. This measure permits the excessive charge on the filtering capacitor $C_f$ to be discharged within time far shorter than the charging time thereof with the result that crossover distortion at higher frequencies is fully eliminated without affecting the system for both the quiescent current and the lower frequency signal.

Figure 15:
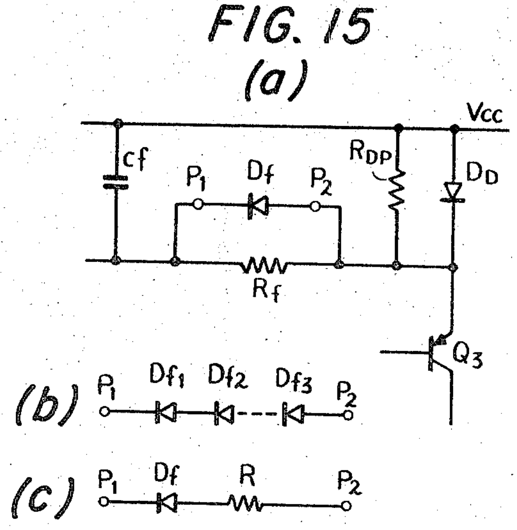
FIGS. 15*a*, *b* and *c* are schematic circuit diagrams illustrating the manner in which a frequency range in which the class AB operation is performed is extended.

If the diode $D_f$ affects the discharge of the capacitor $C_f$ too much, as in the case the transistor $Q_A$ and $D_f$ respectively are for example of silicon and germanium respectively then a plurality of semiconductor diodes $D_{f1}$, $D_{f2}$, $D_{f3}$ may be serially connected between points $P_1$ and $P_2$ representative of both ends of the resitor $R_f$ as shown in FIG. 15*b*. Alternatively a resistor R may be connected in series to the diode $D_f$ between the points $P_1$ and $P_2$ or across the resistor $R_f$.

Figure 16:
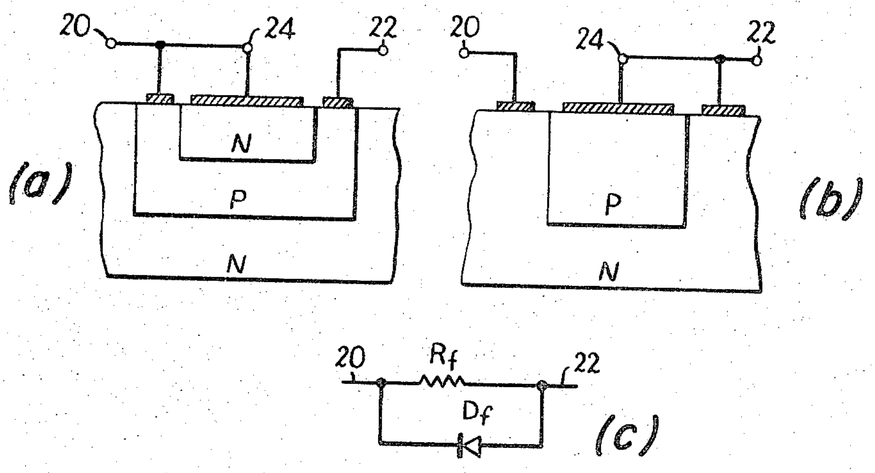
FIGS. 16*a* and *b* are fragmental views of the parallel arrangement of diodes and resistors constructed in integrated circuits.
FIG. 16*c* is a diagram of an electric circuit equivalent to the structures illustrated in FIGS. 16*a* and *b*.

As shown in FIG. 16, the diode $D_f$ as above described may be easily and economically formed into the associated integrated circuit through the utilization of one portion of the associated substrate on which the resistor $R_f$ is disposed. More specifically, FIG. 16*a* shows an NPN type transistor including a base region utilized as the resistor $R_f$ and an upper P-N junction utilized as the diode $D_f$. A terminal 20 electrically coupled to the P type base region is connected to a terminal 24 electrically coupled to the N type emitter region to provide a parallel arrangement of the resistor $R_f$ and diode $D_f$ between the terminal 20 and a terminal 22 electrically coupled to the base region as shown in FIG. 16*c*. FIG. 16*b* shows a semiconductor diode including an N type region utilized as the resistor $R_f$ and a P-N junction utilized as the diode $D_f$ a terminal 24 electrically coupled to the P type region is connected to a terminal electrically coupled to the N type region to provide a similar arrangement between a terminal 20 electrically coupled to the N type region and the terminal 22 as shown in FIG. 16*c*. FIG. 16*c* shows a circuit equivalent to the arrangement as illustrated in FIG. 16*a* or *b*.

What I claim is:

1. An electronic circuit for controlling conduction of a first active element connected in series circuit relationship between a source of electrical power and a load, comprising bias control means coupled to said active element for controlling the bias thereof, detector means connected between said source and said active element to detect current flowing through said active element, said detector means including the parallel combination of a diode and a resistor, low-pass filter means connected to said detector means to remove an alternating current component from the signal detected by said detector means and to provide a substantially direct current output, and coupling means connected between said detector means and said bias control means for coupling said direct current output to said bias control means.

2. An electronic circuit as claimed in claim 1 in which said coupling means comprises amplifier means connected to said low-pass filter means to amplify the output signal thereof, and in which said bias control means comprises a three terminal control element controlled with said amplified output signal.

3. An electronic circuit as claimed in claim 1 in which said low-pass filter means includes an isolation resistor and a capacitor, and said coupling means comprises amplifier means for amplifying the output from said low-pass filter means, said isolating resistor being connected between said detector means and said amplifier means, and said capacitor being connected between said source and said amplifier means.

4. An electronic circuit as set forth in claim 1, further comprising a second active element and a second source of electrical power, said second active element being connected in a complementary circuit relationship with said first active element and being connected in series with said second source of electrical power and said load.

5. An electronic circuit for controlling conduction of first and second semiconductor elements each having first and second principal conducting electrodes and a control electrode, said first electrodes being connected together and to a load, and said second electrodes being coupled to first and second electrical power sources, wherein said electronic circuit comprises detector means connected between one of said second electrodes and one of said electrical power sources, bias control means, and low-pass filter means coupled between said detector means and said bias control means, said bias control means comprising a third semiconductor having a first principal conducting electrode connected to the control electrode of said first semiconductor element, having a second principal conducting electrode connected to the control electrode of said second semiconductor element, and having a control electrode coupled to said low-pass filter.

6. The invention as set forth in claim 5 further comprising amplifier means connecting said low-pass filter to said control electrode of said third semiconductor element.

7. The invention as set forth in claim 5 in which said detector means comprises a resistor and diode connected in parallel.

8. The invention as set forth in claim 5, in which said low-pass filter comprises a resistor having one said connected to said detector means, and a capacitor having one side connected to the other side of said resistor and the other side connected to said one of said power sources.

References Cited

UNITED STATES PATENTS

| | | | |
|---|---|---|---|
| 3,015,075 | 12/1961 | Bargellini | 330—40X |
| 3,378,780 | 4/1968 | Lin | 330—174X |
| 3,381,235 | 4/1968 | Campbell | 330—40 |
| 3,434,066 | 3/1969 | Huntley | 330—22X |

ROY LAKE, Primary Examiner

J. B. MULLINS, Assistant Examiner

U.S. Cl. X.R.

330—17, 22, 40